US006623787B2

(12) United States Patent
Bowers, Jr. et al.

(10) Patent No.: US 6,623,787 B2
(45) Date of Patent: Sep. 23, 2003

(54) METHOD TO IMPROVE THE STABILITY OF DISPERSIONS OF CARBON

(75) Inventors: Joseph S. Bowers, Jr., Lakeville, MN (US); Roger F. Bernards, South Haven, MN (US)

(73) Assignee: Electrochemicals Inc., Maple Plain, MN (US)

( * ) Notice: Subject to any disclaimer, the term of this patent is extended or adjusted under 35 U.S.C. 154(b) by 31 days.

(21) Appl. No.: 09/915,444

(22) Filed: Jul. 26, 2001

(65) Prior Publication Data

US 2003/0022945 A1 Jan. 30, 2003

(51) Int. Cl.⁷ .............................. B01F 3/12; B05D 1/18; B05D 5/12; C09C 1/44; C09C 1/48
(52) U.S. Cl. ...................... 427/96; 106/31.92; 106/472; 106/478; 422/41; 427/430.1; 516/38
(58) Field of Search ...................... 516/38; 106/31.92, 106/472, 478; 427/96, 430.1

(56) References Cited

U.S. PATENT DOCUMENTS

| | | | |
|---|---|---|---|
| 3,152,996 A | * 10/1964 | Forrester | |
| 3,398,009 A | * 8/1968 | Deery | |
| 4,435,378 A | * 3/1984 | Reck et al. | |
| 4,602,473 A | 7/1986 | Hayashi et al. | ............... 53/510 |
| 4,622,107 A | 11/1986 | Piano | ......................... 204/15 |
| 4,622,108 A | 11/1986 | Polakovic et al. | ........... 204/15 |
| 4,631,117 A | 12/1986 | Minten et al. | ................ 204/15 |
| 4,718,993 A | 1/1988 | Cupta et al. | .................. 204/15 |
| 4,874,477 A | 10/1989 | Pendleton | .................... 204/15 |
| 4,897,164 A | 1/1990 | Piano et al. | ................... 204/15 |
| 4,964,959 A | 10/1990 | Nelsen et al. | ................. 204/15 |
| 5,030,367 A | 7/1991 | Tanaka et al. | |
| 5,139,642 A | 8/1992 | Randolph et al. | ........... 205/125 |
| 5,389,270 A | 2/1995 | Thorn et al. | |
| 5,476,580 A | 12/1995 | Thorn et al. | ................. 205/122 |
| 5,536,386 A | 7/1996 | Ferrier et al. | ................ 205/125 |
| 5,609,671 A | * 3/1997 | Nagasawa | ............... 106/478 X |
| 5,632,927 A | 5/1997 | Ferrier et al. | .............. 252/62.2 |
| 5,641,689 A | * 6/1997 | Van Doorn et al. | ....... 516/38 X |
| 5,690,805 A | 11/1997 | Thorn et al. | ................. 205/118 |
| 5,718,746 A | * 2/1998 | Nagasawa et al. | ...... 106/478 X |
| 5,725,807 A | 3/1998 | Thorn et al. | ................. 252/510 |
| 5,759,378 A | 6/1998 | Ferrier et al. | ................ 205/159 |
| 5,759,728 A | 6/1998 | Hagi et al. | .................. 430/106 |
| 5,800,739 A | 9/1998 | Sonnenberg et al. | ........ 252/510 |
| 5,846,307 A | * 12/1998 | Nagasawa et al. | ...... 106/478 X |
| 6,037,020 A | 3/2000 | Garlough et al. | ........... 427/600 |
| 6,099,632 A | * 8/2000 | Nagasawa et al. | ...... 106/478 X |
| 6,125,613 A | 10/2000 | Eberhardt, Jr. et al. | ........ 53/432 |
| 6,171,382 B1 | 1/2001 | Stubbe et al. | .............. 106/31.9 |
| 6,171,468 B1 | 1/2001 | Thorn et al. | ................. 205/118 |
| 6,235,182 B1 * | 5/2001 | Bele et al. | ................. 427/96 X |

* cited by examiner

Primary Examiner—Richard D. Lovering
(74) Attorney, Agent, or Firm—McAndrews, Held & Malloy, Ltd.

(57) ABSTRACT

A method for preventing a carbon dispersion from increasing in viscosity during use is described. The dispersion comprises graphite particles or carbon black particles or a combination of both dispersed in a fluid. The method involves lowering the susceptibility of the carbon dispersion to an increase in viscosity or ionic strength by lowering its pH or reducing its exposure to reactive components in the ambient atmospheric gas. The pH can be lowered by at least partially removing ammonia from the dispersion, or by adding a material that reduces the pH of the dispersion. The stability of the dispersion can also be improved by isolating the dispersion from reactive atmospheric gas. The stabilized aqueous carbon dispersion can have a viscosity of less than about 20 cps and a conductivity of less than about 3 mS.

14 Claims, No Drawings

METHOD TO IMPROVE THE STABILITY OF DISPERSIONS OF CARBON

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF THE INVENTION

The invention described herein relates to aqueous carbon based dispersions. In particular, it relates to improving the stability of an alkaline carbon based aqueous dispersion while it is exposed to air during use.

Aqueous carbon dispersions, based on carbon black, graphite, or both types of particles, are used in a variety of commercial applications. The use of aqueous carbon black dispersions as inks for printing and black toner for electrostatic imaging is described in U.S. Pat. Nos. 6,171,382 and 5,759,728, respectively. The use of aqueous graphite-based dispersions as lubricants is described in U.S. Pat. No. 5,030,367. In addition, both carbon black and graphite based aqueous dispersions are used in coating printed circuit boards for electroplating as described in U.S. Pat. Nos. 5,389,270; 5,476,580; 5,632,927; 5,690,805; 5,725,807; 5,800,739; 6,037,020; and 6,171,468. Each identified patent is incorporated herein by reference for the disclosure of uses of carbon-based aqueous dispersions. Other graphite and carbon dispersions are described in U.S. Pat. Nos. 4,622,107; 4,622,108; 4,631,117; 4,718,993; 4,874,477; 4,897,164; 4,964,959; 5,139,642; 5,536,386; 5,632,927; and 5,759,378.

In coating printed circuit boards, the carbon particles are used to produce an electrically conductive coating that acts as a seed layer upon which metals can be electroplated. The electroplating process thus selectively forms a metal interconnect between two separate circuits. A variety of aqueous dispersions of carbon particles, including carbon black and graphite, are commercially available for this use. One commercially available aqueous dispersion of carbon for this use is sold under the trademark SHADOW® by Electrochemicals Inc., Maple Plain, Minn.

Aqueous carbon dispersions are unstable during use. The viscosity of the dispersion increases with time. The carbon particles eventually flocculate and settle, thus rendering the dispersion ineffective for coating a substrate. The dispersion must then be replaced before additional substrates can be coated. The limited lifetime of carbon based aqueous dispersions slows production and increases the cost of producing printed circuit boards.

While the invention is not limited by the accuracy of this theory, the inventors believe that at least one cause of this instability problem is interaction between an alkaline ingredient in the carbon dispersion and the atmosphere. For example, carbon dioxide in ambient air can react with ammonia or a hydroxide ion in the dispersion to produce carbonates—ionic salts which change the pH of the carbon dispersion and increase the ionic strength of the solution, making it less stable. Other examples of reactive gases are given in the detailed description of this specification.

One approach to this instability problem has been adding a stabilizer that binds the carbon particles to prevent the dispersion breakdown. However, U.S. Pat. No. 5,800,739 in column 3, lines 11–20, teaches, "It has been found that when a stabilizer is added to the dispersion to enhance stability, the stabilizer envelopes [sic] the particles within the dispersion and forms an electrically insulative coating over the particles. Therefore when the particles are coated onto a substrate, the particles which are initially poorly conductive become less conductive because of the insulating layer of the stabilizer thereby further limiting the commercial use of the same." Also in U.S. Pat. No. 5,800,739, the inventors disclose a stabilizing agent that is said to improve the stability of the dispersion while maintaining the conductivity of the resulting coatings.

BRIEF SUMMARY OF THE INVENTION

Accordingly, it is an object of the invention to improve the stability of carbon-based aqueous dispersions during use.

The preceding object, or one or more other objects which will become plain upon consideration of the present specification, are satisfied at least in part by the invention described herein.

One aspect of the invention is a method to stabilize an aqueous dispersion of carbon that is susceptible to a viscosity increase during use. The dispersion of carbon initially has a pH of at least 7.5. The alkalinity of the dispersion is reduced, and in turn, the susceptibility of the dispersion to a viscosity increase is reduced. The method is applicable to dispersions containing a variety of carbon types including carbon black or graphite particles.

In another aspect of the invention the ammonia content in the aqueous dispersion of carbon is reduced without substantially raising the ionic strength. The concentration of ammonia is reduced by adding an agent to reduce the pH or by forcing the ammonia out of solution. An example of forcing the ammonia out of solution is purging the solution with an inert fluid such as nitrogen or air depleted of carbon dioxide.

In another aspect of the invention, the aqueous dispersion containing carbon is isolated from reactive atmospheric gas during use. The aqueous dispersion reacts with atmospheric gas. There are many ways the dispersion can be isolated from the reactive gases. One example is to reduce the headspace above the bath, during use. In another example, the headspace is filled with an inert fluid such as nitrogen, argon, or air depleted of carbon dioxide.

Still another aspect of the invention is a substantially stabilized aqueous dispersion of carbon having a viscosity of less than about 20 cps and a conductivity of less than about 3 mS.

BRIEF DESCRIPTION OF THE SEVERAL VIEWS OF THE DRAWING

Not applicable.

DETAILED DESCRIPTION OF THE INVENTION

While the invention will be described in connection with one or more embodiments, it will be understood that the invention is not limited to those embodiments. On the contrary, the invention includes all alternatives, modifications, and equivalents as may be included within the spirit and scope of the appended claims.

The present invention is carried out by providing and stabilizing an aqueous dispersion containing carbon particles. A detailed description of the ingredients in a dispersion of carbon is given. Also, methods of stabilizing the dispersion of carbon are given.

Definitions

The phrase 'susceptible to viscosity increase' is used throughout this patent. It should be understood to mean the viscosity of a dispersion of carbon would increase upon exposure to reactive atmospheric gas. The phrase 'reactive atmospheric gas' is used here to mean any gas from the immediate surroundings of the dispersion of carbon that may cause an increase in the ionic strength or viscosity of the dispersion. When an aqueous dispersion of carbon with pH at least around 8 is exposed to an atmosphere containing a reactive gas it will absorb the reactive gas causing an increase in viscosity or ionic strength. After some time enough reactive gas will be absorbed to destabilize the dispersion, causing the particles of carbon to flocculate and settle, thus rendering the dispersion less useful for coating substrates. The atmosphere contains a variety of reactive gases that may destabilize the dispersion including, but not limited to, carbon dioxide, oxygen, carbon monoxide, ozone, nitrogen dioxide, nitrous oxide, and sulfur dioxide. A viscosity-unstable dispersion therefore is meant as any dispersion of carbon that is susceptible to a viscosity increase upon exposure to a reactive atmospheric gas.

Viscosity is used throughout this patent to mean the resistance a dispersion presents to flow when a given shear force is applied. It is typically measured in cPs or centipoises and can be defined as grams per centimeter second ((g/cm·sec) and is measured using a variety of techniques including, but not limited to commercial viscometers. Examples of commercial viscometers include capillary flow viscometers and rotational viscometers. A typical aqueous dispersion of carbon, having pH of at least around 7.5 has a viscosity no greater than around 2 cps. The repulsive forces of the carbon particles decrease as the ionic strength increases which in turn causes an increase in the viscosity. A viscosity unstable solution after being exposed to a reactive atmospheric gas for a given period of time will have a viscosity around 10 cps or more. Measurements can be made using a Brookfield spinning viscometer with a VTA-SP35 hollow-cylindrical type spindle measuring 1.887 inches (4.792 cm) in diameter and 1.600 inches (4.064 cm) in length.

Ionic strength is used throughout this patent to mean the concentration of ions in a given solution at a given time. The ionic strength of a dispersion is related to its conductivity. Conductivity, the inverse of resistivity, is reported in Siemens/cm, while conductance is a bulk property and has no units of length. Conductance is measured in milliSiemens (mS) or millimhos (1/milliOhms). A Siemen is the electrical conductance of a conductor in which a current of one ampere is produced by applying a potential of one volt.

Carbon Compositions

One component of the present dispersion is solid particles of carbon, for example, carbon black, graphite, or a combination of the two.

The carbon particles should be present in an amount effective to provide a coating of carbon when the composition is applied to a substrate. The carbon may be present as from about 0.1 to about 20% by weight, alternatively from about 0.5 to about 10% by weight, alternatively from about 1% to about 8% by weight, alternatively from about 3% to about 7% by weight, alternatively from about 3.5% by weight to about 5.5% by weight of the composition.

The carbon may have a mean particle size within the range from about 0.05 to about 50 microns, alternatively from about 0.1 microns to less than about 5 microns, alternatively from about 0.5 microns to less than or equal to about 3 microns, alternatively from about 0.7 microns to less than or equal to about 2 microns, alternatively less than 1 micron.

From the perspective of performance and ease of dispersion, particles from the smaller end of the size range are preferred. However, the smaller particles, particularly graphite particles, are more costly.

The carbon black useful herein can be substantially as described in U.S. Pat. No. 5,139,642. The carbon black description of that patent is hereby incorporated herein by reference in its entirety. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other carbon blacks having similar particle sizes and dispersion characteristics.

The graphite useful herein can be substantially as described in U.S. Pat. No. 5,139,642. The graphite description of that patent is hereby incorporated herein by reference in its entirety. In the present compositions, the graphite may be either synthetic or naturally occurring. Accordingly, suitable commercial graphite and graphite dispersions contemplated to be useful herein include: ULTRAFINE GRAPHITE, sold by Showa Denko K. K., Tokyo, Japan; AQUADAG E; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics.

Aqueous dispersions of carbon black or graphite are well known in the art and in related arts, such as lubricating compositions and conductive coatings for other purposes.

Binding Agent

Another component of some of the present compositions is a water soluble or dispersible binding agent for binding the carbon particles. The binding agent is believed to assist the dispersed carbon particles in adhering to the surface of the non-conductive (i.e., dielectric) substrate that is to be made conductive for electroplating. The binding agent should be present in an amount effective to bind the carbon particles to a substrate. The binding agent may be present as from about 0% to about 15% by weight, or from about 0.2 to about 10% by weight, or from about 0.5% to about 6% by weight, or from about 1.5% to about 3% by weight, of the composition for binding to the carbon particles.

The binding agent is preferably any natural or synthetic polymer, polymerizable monomer, or other viscous or solid material (or precursor thereof) that is capable of both adhering to the carbon particles and of receiving an anionic dispersing agent (as described below), if an anionic dispersing agent is used. Alternatively, the binding agent itself can be capable of dispersing the carbon particles to which it adheres in the aqueous medium of the dispersion. For example, the binding agent may be water soluble or water dispersible material selected from the group consisting of mono- and polysaccharides (or, more broadly, carbohydrates) and anionic polymers. Polysaccharide (which for the present purposes includes disaccharide and higher saccharide) binding agents contemplated for use herein include corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemi-cellulose polysaccharides contemplated for use herein include d-gluco-d-mannans, d-galacto-d-gluco-d-mannans, and others. Anionic polymers contemplated herein include the alkylcelluloses or carboxyalkylcelluloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethylcellulose, which are all commercially available from Aqualon Company of Hopewell, Va.; ethylcellulose, available from Hercules of Wilmington, Del.; METHOCEL cellulose ethers, available from Dow Chemical Co., Midland, Mich.; and nitrocellulose, which is also available from Hercules.

As is plain from the foregoing and the further disclosure incorporated by reference above, organic binding agents are preferred, although inorganic binding agents are also contemplated for use herein.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the present compositions is an anionic dispersing agent. The anionic dispersing agent has a molecular weight less than about 1000 Daltons, so it is a substantially smaller molecule than the binding agent.

The anionic dispersing agent has a hydrophobic end and a hydrophilic (anionic) end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus to disperse.

The amount of anionic dispersing agent contemplated for the purposes of the present invention is an amount sufficient to cause the bound carbon particles to disperse in the aqueous dispersing medium. For example, the anionic dispersing agent may be present as from about 0% to about 10% by weight, alternatively from about 0.01% to about 5% by weight, alternatively from about 0.1% to about 2% by weight of the composition. A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Some of the previously defined binding agents of the present invention have an anionic character, and are also contemplated to be suitable as the anionic dispersing agent herein.

Specific dispersing agents contemplated herein include ACRYSOL I-1955 and ACRYSOL I-545 dispersing agents, both of which are commercially available from the Rohm and Haas Co., Philadelphia, Pa. The ACRYSOL dispersing agents may be used alone or together, preferably together. A preferred weight ratio of ACRYSOL I-1955 to ACRYSOL I-545 is about 1:4.

Surfactants

An optional component of some of the compositions of the present invention is a surfactant. One function of the surfactant is to decrease the surface tension of the aqueous dispersing medium, so the aqueous dispersing medium containing the dispersed carbon particles is able to freely penetrate into the recesses. A second function of the surfactant is to wet the surfaces of the polymeric and glass substrates. This facilitates the coating of these surfaces with the carbon dispersion.

The amount of surfactant that is used in any particular case will vary depending upon the surfactant itself. The composition typically contains from about 0.01% to about 10% by weight, or from about 0.02% to about 3% by weight, or from about 0.05% to about 1% by weight of the composition, of the surfactant.

Suitable surfactants for use in the present invention include TRITON X-100, sold by Rohm and Haas Co., Philadelphia, Pa.; MAPHOS 56, sold by Mazer Chemicals, Inc.; TAMOL 819L-43, 850, and 960 anionic surfactants, available from Rohm and Haas Co., Philadelphia, Pa.; FLUORAD® FC-120, FC-430, FC-431, FC-129, and FC-135 anionic fluorochemical surfactants; sold by Minnesota Mining & Manufacturing Co., St. Paul, Minn.; DARVAN No. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others. Cationic and other surfactants may also be used, depending upon the pH and other characteristics of the composition.

Aqueous Dispersing Medium

Another component of the compositions of the present invention is an aqueous dispersing medium. The phrase, "aqueous dispersing medium," as used herein, includes any liquid that is from 80 to 100% water wherein the balance of the material is a water soluble composition. Typical water-soluble compositions include the low molecular weight alcohols, such as methanol, ethanol, and isopropanol. Additional solvents such as dimethylsulfoxide, tetrahydrofuran, and ethylene or propylene glycol may also be used. Alternatively, the aqueous dispersing medium may be 100% water. Deionized water is preferred.

Another component of the compositions of the present invention is a source of basicity, for example ammonia. The ammonia is used to produce a stable dispersion during storage, giving it the basicity needed to disperse the carbon. A variety of sources of ammonia are useful including gaseous ammonia or a solution of ammonia in some suitable fluid, preferably water. The amount of ammonia incorporated depends on how basic the aqueous dispersion of carbon must be to substantially disperse the carbon particles. The desired concentration of ammonia in the dispersion is in the range of about 10 mM to about 100 mM, or alternatively from about 20 mM to about 80 mM, or alternatively from about 30 mM to 60 mM, and alternatively from about 40 mM to about 50 mM. The resultant pH of the solution is dependant on the amount of ammonia in solution and is in the range of 4 to 15. Alternatively the pH is about 7 to 12, or alternatively the pH is between about 8 and 11.

The ammonia is used to produce a storage stable dispersion, giving it the basicity needed to disperse the carbon, yet it is understood that a high basicity will render the dispersion susceptible to a viscosity increase and instability during use. The term 'instability during use' is used throughout this patent and should be understood to indicate an increase in viscosity or ionic strength in the dispersion while it is being used to produce a coating on a substrate.

Other bases can also contribute some or all of the basicity of the composition. Water-soluble bases are specifically contemplated here. Other water-soluble bases include alkali metal hydroxide bases such as potassium hydroxide, sodium hydroxide, and lithium hydroxide. Other suitable bases include alkali metal carbonates, phosphates, borates, acetates and citrates.

Other ingredients may also be added to the carbon composition in any desired amount not inconsistent with using the carbon composition to deposit a carbon coating on a substrate.

One specifically contemplated composition is a carbon dispersion that is capable of depositing a uniform coating of carbon particles on a non-conductive surface. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

Equipment

The dispersion of carbon may be coated onto a substrate in a number of ways including, but not limited to dipping the substrate into a bath containing the dispersion of carbon. Alternatively, the dispersion of carbon can be sprayed or poured on the substrate while the substrate is held stationary or spun at a given speed.

A typical vessel for coating substrates by dipping comprises a bath and pump for holding and recirculating the dispersion of carbon, respectively. The vessel may also comprise a sump at the bottom of the bath to which the inlet of the recirculation pump is connected. The pump draws the dispersion from the sump and circulates it toward the top of the bath to prevent settling and maintain agitation in the dispersion of carbon. Above the bath, the vessel will comprise some limited amount of headspace. Optionally, a filter is connected to the bath to filter the dispersion of carbon to remove particles exceeding a given size. Optionally, a cover can be provided that fits over the bath containing the dispersion to limit the headspace volume. Optionally, a valve is connected to the vessel to allow for a fluid inlet/outlet system or optionally a vacuum inlet/outlet system. Optionally, an ultrasonic transducer is connected to the bath to deliver ultrasonic waves to the bath. The location of the transducer may be in the sump or elsewhere in the bath.

A commercial conductivity meter can be used to measure the conductance of a dispersion. For example, dispersion conductivities can be measured using a Technika brand conductivity meter, with a probe that has a length of 5 inches (12.7 cm) and a diameter of ⅞ of an inch (2.22 cm), at ambient conditions of temperature and humidity. Distilled water has a conductivity in the range of 0.0005 to 0.003 mS/cm$^2$. An aqueous dispersion of graphite with pH of at least about 7 will have a conductance around 0.9 mS (milliSiemens). A viscosity-unstable dispersion that has been exposed to reactive atmospheric gas will have a viscosity greater than 10 cps with conductance greater than 1.5 mS, and in some instances as high as 3.5 or 4 mS or more.

The conductance of the dispersion is related to its stability. It is desirable for the conductance of the dispersion of carbon to be low because an increase in conductance means an increase in the ionic strength. As the ionic strength increases the repulsive forces between carbon particles in the dispersion will decrease, causing an increase in viscosity and a decrease in bath life of the dispersion of carbon. Therefore, the conductance should be below around 15 mS, alternatively below around 10 mS, alternatively below around 5 mS, alternatively below around 2.0 mS, alternatively around 1.3 mS.

Stabilizing Methods

One embodiment of the invention is carried out by reducing the basicity of the carbon dispersion during use. This can be done by a variety of techniques, not limited by those techniques described here. One example of the invention is to add a reagent to the dispersion to reduce its alkalinity without increasing its ionic strength. An example of this is adding a substance such as an anhydride, ester, nitrile, or any substance that will react with the ammonia and form non-ionic addition products. Another example of this is to add a substance that reacts with ammonia to form an easily removable precipitate. This may be done before the bath is put into service, so the precipitate can be filtered from the solution, as by the filter used to strain large particles out of the bath.

Another embodiment of the invention is purging the dispersion with an inert fluid to remove at least a portion of the ammonia, thereby at least reducing its basicity and susceptibility to a viscosity increase. Without intending to limit the invention according to the accuracy or applicability of this theory, the inventors believe that purging the dispersion with an inert fluid gives the ammonia, which is volatile, a greater opportunity to evaporate and thus escape to the atmosphere.

An "inert fluid" as used here is any fluid that has less tendency than atmospheric air to cause a viscosity increase or increase in ionic strength of the dispersion. There are a variety of useful inert fluids including, but not limited to, gaseous and liquid nitrogen, argon, helium, or scrubbed air. Scrubbed air as used here is any atmospheric gas that has been treated in such a way as to at least partially remove a substance that causes a viscosity or conductivity increase in the dispersion.

Atmospheric air typically contains a mixture of gases in various ratios. Under ambient conditions, one liter (1L) of atmospheric air contains about 300 $\mu$L (microliters) of carbon dioxide, 1 $\mu$L of carbon monoxide and sulfur dioxide, 0.5 $\mu$L of nitrogen dioxide, and less than 0.1 $\mu$L of ozone. However, in 1 liter (1L) of scrubbed air, under ambient conditions, the level of carbon dioxide can be partially reduced to, for example, no greater than about 200 $\mu$L, optionally no greater than about 100 $\mu$L, and optionally no greater than about 50 $\mu$L. By at least partially removing the ammonia from the dispersion with an inert fluid, the basicity is at least partially reduced and the viscosity-unstable dispersion is at least partially stabilized allowing for a longer bath life.

The alkalinity of the viscosity-unstable dispersion is only partially reduced in the embodiment. The pH of the partially stabilized dispersion is at least around 7 and no greater than around 11. Alternatively the pH of the partially stabilized dispersion is at least around 8 and no greater than around 10. Alternatively the pH of the partially stabilized dispersion is at least 9.0 and no greater than around 9.5.

In another embodiment of the invention the viscosity-unstable dispersion is at least partially isolated from a reactive atmospheric gas. The term isolating means at least partially separating a reactive atmospheric gas from the bath. Headspace is used here to mean any local space within the vessel containing the dispersion of carbon that contains at least one reactive atmospheric gas. One example of this is to physically at least partially reduce the headspace above the dispersion in the bath. Another example of this is to at least partially remove the atmospheric gas by way of vacuum aspiration. And yet another example of this is to at least partially fill the headspace with an inert fluid. In one embodiment, the inert fluid floats on top of the dispersion so the dispersion does not become exposed to any reactive atmospheric gases. Inert fluids that work would have a density lower than the dispersion and a higher density than atmospheric air. Alternatively, this can be done by periodically partially purging the headspace with an inert fluid. In this embodiment the exposure of the dispersion of carbon to atmospheric air is at least partially reduced during use.

Another possibility is to put a lid on the dispersion between uses or when the bath is idle, as it may be overnight. The lid can go on the vessel. In this case the headspace can be reduced, as by topping off the bath, or replaced with an inert fluid. The lid can also float on the surface of the dispersion, separating the dispersion from its headspace.

EXAMPLE 1

Two identical graphite binder solutions were prepared at 4% solids. The pH of each solution was 9.8 and each contained 41 mN $NH_3$. The solution conductance was 1.4 mS. The conductivity was measured using a Technika brand conductivity meter as described previously, at ambient conditions for temperature and humidity. The viscosities of the dispersions were 4 cps. Viscosity measurements were made using a Brookfield spinning viscometer with a VTA-SP35 hollow-cylindrical type spindle measuring 1.887 inches (4.792 cm) in diameter and 1.600 inches (4.064 cm) in length.

$N_2$ was bubbled through one solution until the pH was lowered to 9.09. The conductance of the dispersion was found to be 1.23 mS after bubbling with $N_2$. To the second dispersion nothing was done. Both dispersions were then bubbled with $CO_2$ for 1 minute to simulate long-term reactive air exposure. The dispersion to which nothing was done increased in conductance to 5.23 mS and the solution viscosity rose to over 30 cps. The conductance of the dispersion that was bubbled with $N_2$ to lower the pH to 9.09 rose only to 2.05 mS and the viscosity was 4.0 cps.

Example 1 demonstrates that, by reducing the concentration of ammonia, or otherwise reducing the alkalinity of the dispersion of carbon, the conductance and viscosity did not substantially increase during exposure to carbon dioxide. Based on this result, the bath life of the dispersion of carbon increases, despite exposure of the bath to reactive atmospheric gas during use.

What is claimed is:

1. A method of stabilizing a carbon dispersion, comprising:
   A. providing a viscosity-unstable aqueous dispersion of carbon that has a pH of at least 7.5 and is susceptible to a viscosity increase during use; and
   B. reducing the alkalinity of the viscosity-unstable aqueous dispersion of carbon by an amount effective to reduce the susceptibility of the carbon dispersion to a viscosity increase;
   wherein said viscosity-unstable aqueous dispersion of carbon comprises ammonia in a concentration sufficient to make it susceptible to a viscosity increase when exposed to the atmosphere.

2. The method of claim 1, wherein the viscosity-unstable aqueous carbon dispersion contains at least 40 mM ammonia.

3. The method of claim 1, wherein the viscosity-unstable aqueous carbon dispersion contains at least 50 mM ammonia.

4. The method of claim 1, wherein the viscosity-unstable aqueous carbon dispersion contains 60 mM ammonia.

5. The method of claim 1, wherein the alkalinity reducing step is carried out by reducing the concentration of ammonia in the aqueous carbon dispersion to no greater than pH 9.

6. The method of claim 1, wherein the alkalinity reducing step is carried out by reducing the concentration of ammonia in the aqueous carbon dispersion to no greater than pH 8.

7. The method of claim 1, wherein the alkalinity reducing step is carried out by forcing ammonia out of solution in the viscosity-unstable aqueous dispersion of carbon.

8. The method of claim 1, wherein the alkalinity reducing step is carried out by purging the viscosity-unstable aqueous dispersion of carbon with an inert fluid.

9. The method of claim 8, wherein said inert fluid comprises nitrogen.

10. The method of claim 8, wherein said inert fluid comprises argon.

11. The method of claim 8, wherein said inert fluid comprises air at least partially depleted of carbon dioxide.

12. A method of stabilizing a carbon dispersion, comprising:
   A. providing a viscosity-unstable aqueous dispersion of carbon that has a pH of at least 7.5 and is susceptible to a viscosity increase during use; and
   B. reducing the alkalinity of the viscosity-unstable aqueous dispersion of carbon by an amount effective to reduce the susceptibility of the carbon dispersion to a viscosity increase;
   wherein the alkalinity reducing step is carried out by adding an agent to the viscosity-unstable aqueous dispersion of carbon to lower its pH without substantially raising its ionic strength.

13. A method of stabilizing a carbon dispersion, comprising:
   A. providing a viscosity-unstable aqueous dispersion of carbon that comprises ammonia, has a pH of at least 7.5, and is susceptible to a viscosity increase during use;
   B. reducing the ammonia content of the viscosity-unstable aqueous dispersion of carbon, at least substantially without allowing the ionic strength of the solution to increase significantly.

14. A method of coating a substrate with a carbon dispersion, comprising:
   A. providing a viscosity-unstable aqueous dispersion of carbon that has a pH of at least 7.5 and is susceptible to a viscosity increase during use, the viscosity-unstable aqueous dispersion having a bath life for coating substrates;
   B. reducing the alkalinity of the viscosity-unstable aqueous dispersion of carbon by an amount effective to reduce the susceptibility of the carbon dispersion to a viscosity increase, in a way that does not increase its ionic strength substantially, thereby increasing its bath life and providing a stabilized dispersion;
   C. maintaining the stabilized dispersion for a period of time exceeding the bath life of the viscosity-unstable aqueous dispersion; and
   D. after the maintaining step, coating a substrate with the stabilized dispersion.

* * * * *